(12) United States Patent
Lee et al.

(10) Patent No.: US 11,450,402 B1
(45) Date of Patent: Sep. 20, 2022

(54) SENSING CIRCUIT AND TEST DEVICE

(71) Applicant: Powerchip Semiconductor Manufacturing Corporation, Hsinchu (TW)

(72) Inventors: Chien-Fa Lee, Kaohsiung (TW); Yi-Chun Lin, Taichung (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 17/392,273

(22) Filed: Aug. 3, 2021

(30) Foreign Application Priority Data

May 17, 2021 (TW) ................... 110117683

(51) Int. Cl.
*G11C 29/50* (2006.01)
*G11C 17/18* (2006.01)

(52) U.S. Cl.
CPC .............. *G11C 29/50* (2013.01); *G11C 17/18* (2013.01); *G11C 2029/5004* (2013.01)

(58) Field of Classification Search
CPC ...................................... G11C 29/50
USPC ...................................... 365/185.21
See application file for complete search history.

(56) References Cited

U.S. PATENT DOCUMENTS 5,181,187 A    1/1993 Jenq
8,362,807 B2 * 1/2013 Upputuri ............. H03F 3/45179
                                          327/51
8,908,459 B2 * 12/2014 Kowalczyk ......... G11C 11/4074
                                          365/210.11
2002/0021605 A1   2/2002 Harada et al.
2006/0220587 A1 * 10/2006 Tobita ................. G11C 19/184
                                          315/194
2010/0054051 A1 * 3/2010 De La Cruz, II ..... G11C 11/412
                                          365/189.11

(Continued)

FOREIGN PATENT DOCUMENTS

TW          357351          5/1999
TW          415073         12/2000

(Continued)

OTHER PUBLICATIONS

"Office Action of Taiwan Counterpart Application", dated Nov. 17, 2021, pp. 1-3.

*Primary Examiner* — Muna A Techane
(74) *Attorney, Agent, or Firm* — JCIPRNET

(57) ABSTRACT

A sensing circuit is provided which generates a sensing result according to a reading voltage of a non-volatile memory. The sensing circuit includes four transistors and a switch group. A first transistor is coupled between an operating voltage and a first node. A second transistor is coupled between the first node and a second node. A third transistor is coupled between the second node and a reference ground voltage. A control terminal of the first transistor, a control terminal of the second transistor, and a control terminal of the third transistor all receive the reading voltage. A fourth transistor is coupled between the operating voltage and the first node. The switch group forms or disconnects a conduction path between a control terminal of the fourth transistor and the second node according to a control signal, so that the first node obtains the sensing result.

24 Claims, 10 Drawing Sheets

(56) References Cited

U.S. PATENT DOCUMENTS

2013/0094308 A1* 4/2013 Yang .................. G11C 8/08
                                                    365/191
2020/0395083 A1    12/2020 Hung

FOREIGN PATENT DOCUMENTS

| TW | I409817 | 9/2013 |
| TW | I566518 | 1/2017 |

* cited by examiner

SENSING CIRCUIT AND TEST DEVICE

CROSS-REFERENCE TO RELATED APPLICATION

This application claims the priority benefit of Taiwan application serial no. 110117683, filed on May 17, 2021. The entirety of the above-mentioned patent application is hereby incorporated by reference herein and made a part of this specification.

BACKGROUND

Technical Field

The disclosure relates to a sensing circuit of a memory, and in particular relates to a sensing circuit that can operate in multiple test modes.

Description of Related Art

In recent years, microcontrollers (MCUs) have been widely used in portable electronic products and white goods. Non-volatile memories (NVM), especially one-time programmable (OTP) memories and multi-time programmable (MTP) memories, are the key components in microcontrollers. OTP memories and MTP memories are used to store the program codes of related applications, so that the microcontrollers can be applied to various related electronic products.

However, OTP memories and MTP memories may have some defects due to process variation. The most serious defect is leakage of transistors in OTP memories and MTP memories, particularly, the leakage current from the drain to the source of an N-type metal-oxide-semiconductor field-effect transistor (MOSFET). Due to a leakage path in the transistor, the OTP memory (or MTP memory) may have problems such as an increase in quiescent current and a read bit error, resulting in an abnormal increase in power consumption of the chip. In severe cases, such problems may also cause the microcontroller to malfunction. Generally speaking, an OTP memory (or MTP memory) having a leakage current path with low impedance characteristics can be detected in the chip probing (CP) test stage, so as to prevent defective products from entering the packaging stage and increasing the manufacturing cost. However, it is difficult to detect if the leakage path has high impedance characteristics.

FIG. 1 is a schematic diagram showing a basic circuit structure of an OTP memory (or MTP memory). Referring to FIG. 1, the OTP memory (or MTP memory) 100 may include a current source 101, a load 102, and a transistor Mc. A sense amplifier 103 may receive a reading voltage Vsen of the OTP memory (or MTP memory) 100 to generate a sensing result. In an ideal state, when the transistor Mc is programmed with a writing voltage equivalent to the bit value "0" in the CP detection stage, the transistor Mc is turned off and the reading voltage Vsen is at a high voltage level (close to the operating voltage). At this time, the sensing result equivalent to the bit value "0" can be obtained through the sense amplifier 103. However, when the transistor Mc is programmed with a writing voltage equivalent to the bit value "0" and the transistor Mc has a leakage current path with low impedance characteristics (see the dotted line shown in FIG. 1), the reading voltage Vsen is at a relatively low voltage level (between the ground potential and half the operating voltage), so that the sense amplifier 103 obtains the sensing result equivalent to the bit value "1". By performing the above detection method, it is possible to detect the OTP memory (or MTP memory) 100 that has a leakage current path with low impedance characteristics.

However, when the transistor Mc is programmed with a writing voltage equivalent to the bit value "0" and the transistor Mc has a leakage current path with high impedance characteristics (see the dotted line shown in FIG. 1), the reading voltage Vsen is at a relatively high voltage level (greater than half the operating voltage), which causes the sense amplifier 103 to obtain the same sensing result as the ideal state, that is, the sensing result equivalent to the bit value "0". In other words, the above detection method cannot detect the OTP memory (or MTP memory) 100 that has a leakage current path with high impedance characteristics, and may let it pass the CP test stage by mistake. As a result, when the back-end product is actually used, the leakage current path of the OTP memory (or MTP memory) 100 may change from high-sensing voltage characteristics to low-sensing voltage characteristics under a low-voltage operation of the system, causing the OTP memory (or MTP memory) 100 to have a general failure. Such a situation reduces the reliability of the products and results in a risk of customer complaints.

Therefore, the disclosure provides a solution for detecting an OTP memory (or MTP memory) having a leakage current path with high impedance characteristics in the CP test stage.

SUMMARY

The disclosure provides a sensing circuit and a test device including the sensing circuit, which can detect a non-volatile memory having a leakage current path with high impedance characteristics in the CP test stage.

A sensing circuit of the disclosure is configured to generate a sensing result according to a reading voltage of a non-volatile memory. The sensing circuit includes a first transistor, a second transistor, a third transistor, a fourth transistor, and a switch group. The first transistor is coupled between an operating voltage and a first node. The second transistor is coupled between the first node and a second node. The third transistor is coupled between the second node and a reference ground voltage. A control terminal of the first transistor, a control terminal of the second transistor, and a control terminal of the third transistor all receive the reading voltage. The fourth transistor is coupled between the operating voltage and the first node. The switch group forms or disconnects a conduction path between a control terminal of the fourth transistor and the second node according to a control signal, so that the first node obtains the sensing result.

A test device of the disclosure is configured to generate a test result according to a reading voltage of a non-volatile memory. The test device includes a non-volatile memory, the aforementioned sensing circuit, and a test controller. The non-volatile memory is programmed with a voltage value corresponding to a bit value. The test controller is configured to generate the control signal, so that the switch group disconnects the conduction path according to the control signal to enter a first test mode, and when the sensing result obtained by executing the first test mode is the bit value, cause the switch group to conduct the conduction path according to the control signal to enter a second test mode. The test controller is configured to generate the test result to indicate that the non-volatile memory has a high impedance leakage current path when the sensing result obtained by executing the second test mode is not the bit value.

A test device of the disclosure is configured to generate a test result according to a reading voltage of a non-volatile memory. The test device includes a non-volatile memory, the aforementioned sensing circuit, and a test controller. The non-volatile memory is erased with a voltage value corresponding to a bit value. The test controller is configured to generate the control signal, so that the switch group disconnects the conduction path according to the control signal to enter a first test mode, and when the sensing result obtained by executing the first test mode is not the bit value, cause the switch group to conduct the conduction path according to the control signal to enter a second test mode. The test device is configured to generate the test result to indicate that the sensing result has been corrected for a reading bit value error caused by a high impedance reading path of the non-volatile memory when the sensing result obtained by executing the second test mode is the bit value. In a stage where an end product is used, the sensing circuit is switched to the second test mode for sensing to correct the result, thereby improving the yield.

A sensing circuit of the disclosure is configured to generate a sensing result according to a reading voltage of a non-volatile memory. The sensing circuit includes a first transistor, a second transistor, a third transistor, a fourth transistor, and a switch group. The first transistor is coupled between a first node and a second node, and a control terminal of the first transistor receives the reading voltage. The second transistor is coupled between the second node and a reference ground voltage. The third transistor is coupled between an operating voltage and the first node, and a control terminal of the third transistor is coupled to a control terminal of the second transistor and receives the reading voltage. The fourth transistor is coupled between the second node and the reference ground voltage. The switch group forms or disconnects a conduction path between the first node and a control terminal of the fourth transistor according to a control signal, so that the second node obtains the sensing result.

A test device of the disclosure is configured to generate a test result according to a reading voltage of a non-volatile memory. The test device includes a non-volatile memory, the aforementioned sensing circuit, and a test controller. The non-volatile memory is erased with a voltage value corresponding to a bit value. The test controller is configured to generate the control signal, so that the switch group disconnects the conduction path according to the control signal to enter a first test mode, and when the sensing result obtained by executing the first test mode is the bit value, cause the switch group to conduct the conduction path according to the control signal to enter a second test mode. The test controller is configured to generate the test result to indicate that the non-volatile memory has a high impedance leakage current path when the sensing result obtained by executing the second test mode is not the bit value.

A test device of the disclosure is configured to generate a test result according to a reading voltage of a non-volatile memory. The test device includes a non-volatile memory, the aforementioned sensing circuit, and a test controller. The non-volatile memory is programmed with a voltage value corresponding to a bit value. The test controller is configured to generate the control signal, so that the switch group disconnects the conduction path according to the control signal to enter a first test mode, and when the sensing result obtained by executing the first test mode is not the bit value, cause the switch group to conduct the conduction path according to the control signal to enter a second test mode. The test controller is configured to generate the test result to indicate that the sensing result has been corrected for a reading bit value error caused by a high impedance reading path of the non-volatile memory when the sensing result obtained by executing the second test mode is the bit value. In a stage where an end product is used, the sensing circuit is switched to the second test mode for sensing to correct the result, thereby improving the yield.

Based on the above, the disclosure can perform the first test mode and the second test mode by controlling the operation of the switches in the sensing circuit. The disclosure can detect whether the non-volatile memory has a leakage current path with high impedance characteristics by sequentially performing the first test mode and the second test mode. In this way, it is possible to prevent the problem that a non-volatile memory having a leakage current path with high impedance characteristics passes the test but has a general failure in subsequent use. Therefore, the reliability of the product is improved. Meanwhile, for erroneous detection caused by a high impedance reading path, the sensing circuit is switched to the second test mode and kept in this mode to be applied to the end product, thereby correcting the sensing result and improving the yield.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 2A:
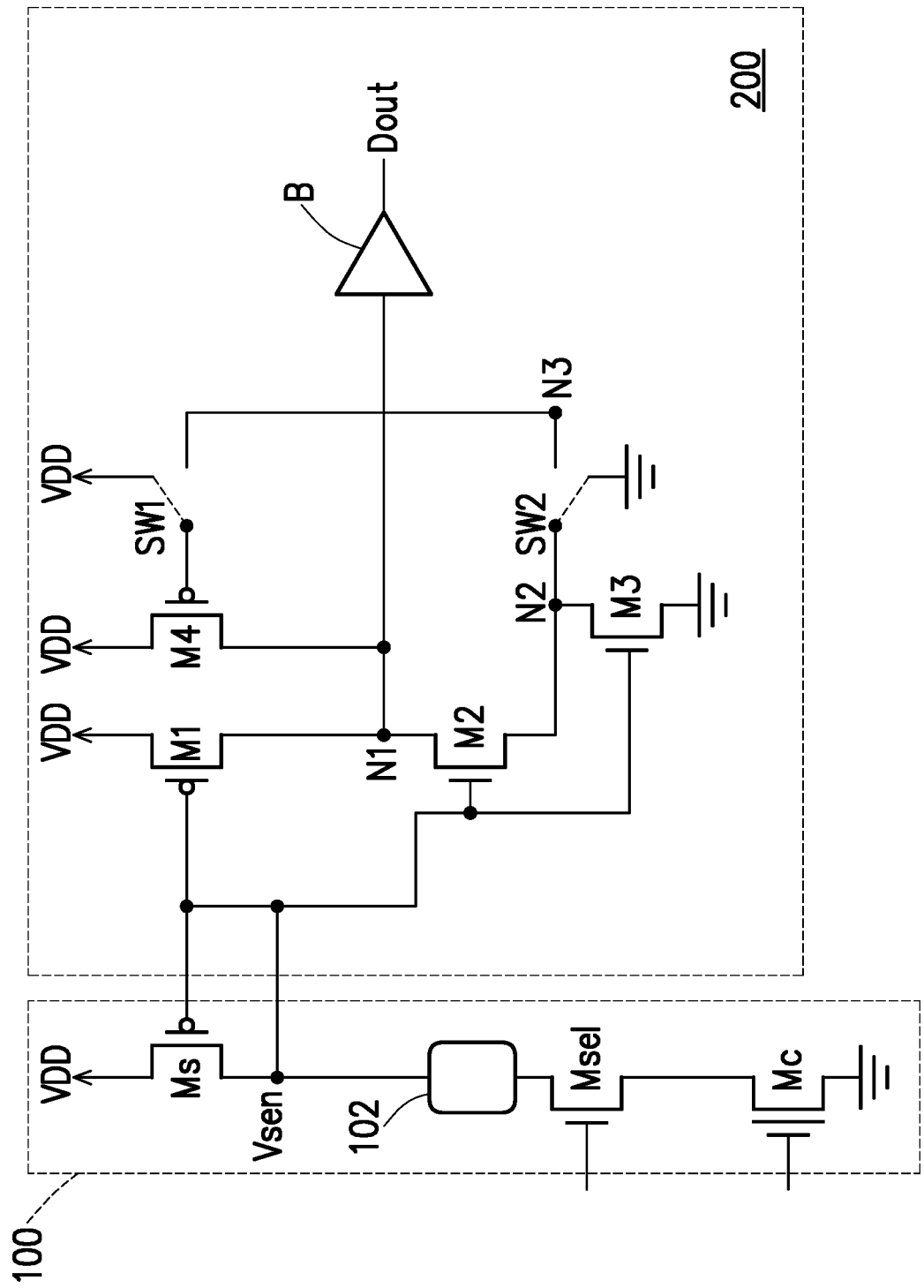
FIG. 2A and FIG. 2B are schematic diagrams showing a circuit structure of a sensing circuit according to the first embodiment of the disclosure.
Figure 2B:
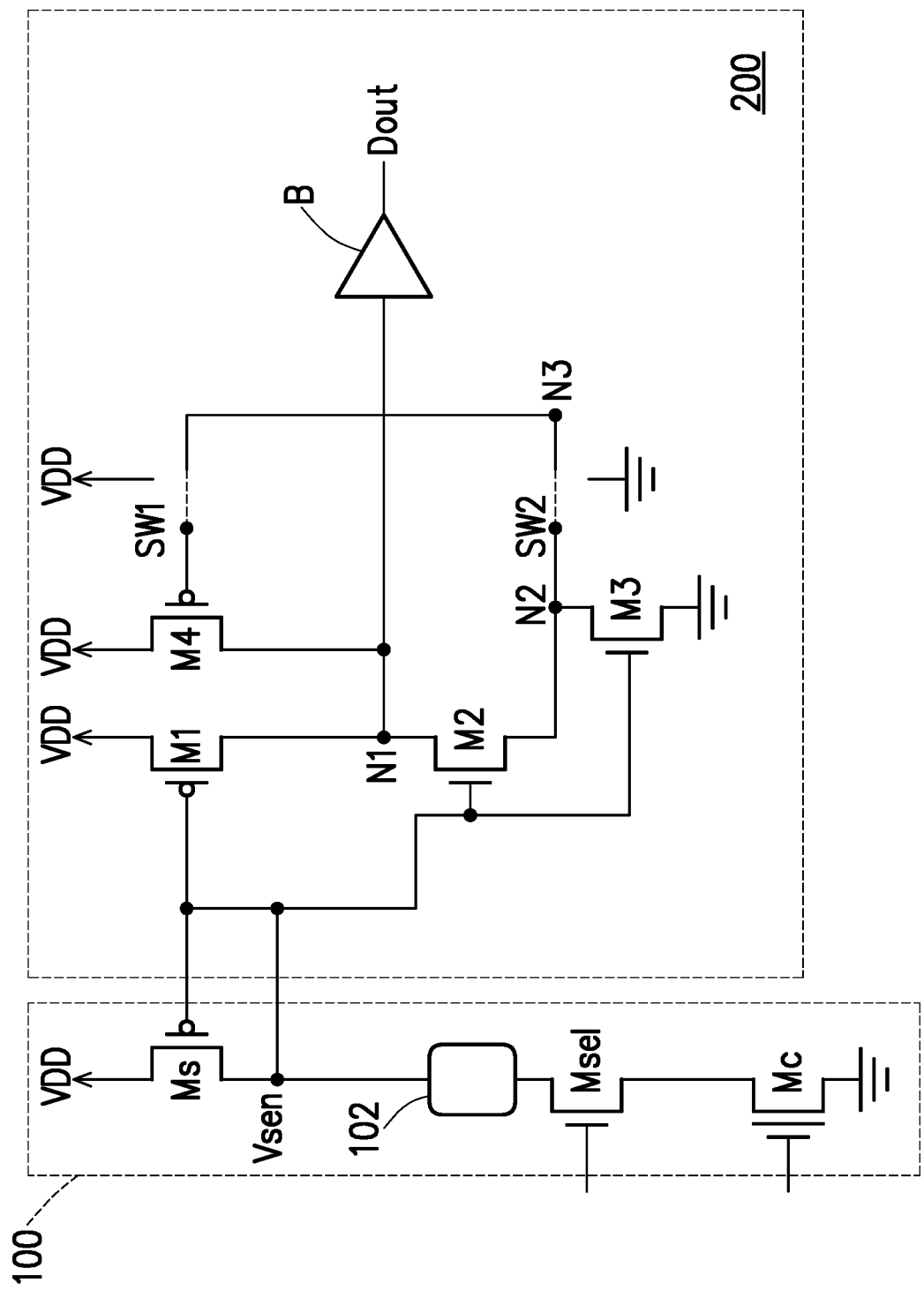

FIG. 2A and FIG. 2B are schematic diagrams showing a circuit structure of a sensing circuit according to the first embodiment of the disclosure. The circuit structure of the sensing circuit shown in FIG. 2A and the circuit structure of the sensing circuit shown in FIG. 2B are exactly the same, and the only difference between the two circuit structures lies in how a switch group (switch SW1 and switch SW2)

operates. Referring to FIG. 2A and FIG. 2B, an OTP memory (or MTP memory) 100 may include a transistor Ms, a load 102, a transistor Msel, and a transistor Mc. The transistor Ms serves as a current source, which is equivalent to a current source 101 in FIG. 1. The functions of the load 102 and the transistor Mc can be found in the descriptions of the elements with the same names in FIG. 1, and will not be repeated hereinafter. When the transistor Msel is turned on, the OTP memory (or MTP memory) 100 can be written and read. Therefore, the transistor Msel is also called a selective transistor. In this embodiment, the transistor Ms may be a P-type MOSFET, and the transistor Msel and the transistor Mc may be N-type MOSFETs.

A sensing circuit 200 is configured to generate a sensing result Dout according to a reading voltage Vsen of the OTP memory (or MTP memory) 100. The sensing circuit 200 includes transistors M1 to M4, the switch SW1, the switch SW2, and a buffer B. The first terminal of the transistor M1 receives an operating voltage VDD. The second terminal of the transistor M1 is coupled to a node N1. The control terminal of the transistor M1 receives the reading voltage Vsen (that is, the operation of the transistor M1 is controlled by the reading voltage Vsen). The first terminal of the transistor M2 is coupled to the node N1. The second terminal of the transistor M2 is coupled to a node N2. The control terminal of the transistor M2 receives the reading voltage Vsen (that is, the operation of the transistor M2 is controlled by the reading voltage Vsen). In this embodiment, the transistor M1 and the transistor M2 constitute an inverter. The first terminal of the transistor M3 is coupled to the node N2. The second terminal of the transistor M3 is coupled to a reference ground voltage. The control terminal of the transistor M3 receives the reading voltage Vsen (that is, the operation of the transistor M3 is controlled by the reading voltage Vsen). The first terminal of the transistor M4 is coupled to the operating voltage VDD. The second terminal of the transistor M4 is coupled to the node N1. The control terminal of the transistor M4 is coupled to the first terminal of the switch SW1. In this embodiment, the transistor M1 and the transistor M4 may be P-type MOSFETs, and the transistor M2 and the transistor M3 may be N-type MOSFETs.

The first terminal of the switch SW1 is coupled to the control terminal of the transistor M4, and the second terminal of the switch SW1 is selectively coupled to one of the operating voltage VDD and a node N3 according to a control signal. The first terminal of the switch SW2 is coupled to the node N2. The second terminal of the switch SW2 is selectively coupled to one of the reference ground voltage and the node N3 according to the control signal. The switch SW1 and the switch SW2 are controlled by the control signal to operate synchronously, thereby constituting a switch group. The switch group forms or disconnects a conduction path from the control terminal of the transistor M4 to the node N2 according to the control signal. For example, when the control signal is at a first voltage level (for example, a high voltage level), the switch SW1 and the switch SW2 operate synchronously to form the aforementioned conduction path. When the control signal is at a second voltage level (for example, a low voltage level), the switch SW1 and the switch SW2 operate synchronously to disconnect the aforementioned conduction path. The input terminal of the buffer B is coupled to the node N1 to receive a voltage signal of the node N1. The function of the buffer B is to digitize the analog voltage signal of the node N1 to output the digital sensing result Dout. In an embodiment, the buffer B may be realized by two inverters connected in series.

As shown in FIG. 2A, when the switch group of the sensing circuit 200 disconnects the conduction path between the control terminal of the transistor M4 and the node N2 according to the control signal, the transistor M3 and the transistor M4 do not operate. In detail, since the transistor M2 is directly grounded via the switch SW2, the transistor M3 is bypassed, which is equivalent to not operating. In addition, since the control terminal of the transistor M4 is connected to the operating voltage VDD via the switch SW1, the transistor M4 is not turned on, which is equivalent to not operating. When the transistor M3 and the transistor M4 do not operate, it is equivalent to that the sensing circuit 200 obtains the sensing result Dout via the inverter (only the transistor M1 and the transistor M2 operate) and the buffer B.

As shown in FIG. 2B, when the switch group of the sensing circuit 200 forms the conduction path between the control terminal of the transistor M4 and the node N2 according to the control signal, the transistors M1 to M4 all operate. The transistor M1 and the transistor M2 still function as the inverter. The transistor M2 and the transistor M3 are connected in series, and the transistor M1 and the transistor M4 are connected in parallel. When the reading voltage Vsen is at the relatively high voltage, the presence of the transistor M3 can increase a threshold voltage of the transistor M2. At this time, the transistor M3 may be fully turned on, while the transistor M2 is partially turned on. In this way, the conduction path of the transistor M2 to the ground is not fully opened, so that the voltage of the node N1 is maintained at a voltage level equivalent to the operating voltage VDD. In other words, the function of the transistor M3 is to improve the resistance (tolerance) of the sensing circuit 200 to the high reading voltage Vsen, and can be used as the first measures to maintain the voltage level of N1 at the high voltage level.

When the voltage value of the reading voltage Vsen is very high, the transistor M2 and the transistor M3 may both be fully turned on. At this time, the node N2 and the node N3 are equal to or close to the reference ground voltage, and the transistor M4 is turned on. The operating voltage VDD passes through the transistor M4 to compensate the current to the node N1, so that the voltage level of the node N1 is pulled up and maintained at a voltage level equivalent to the operating voltage VDD. Therefore, the transistor M4 can be used as the second measures to maintain the voltage level of N1 at the high voltage level. Simply put, in the case of the high reading voltage Vsen, the drop voltage of the node N1 can be compensated to the high voltage level through the transistor M3 and the transistor M4.

Figure 1:
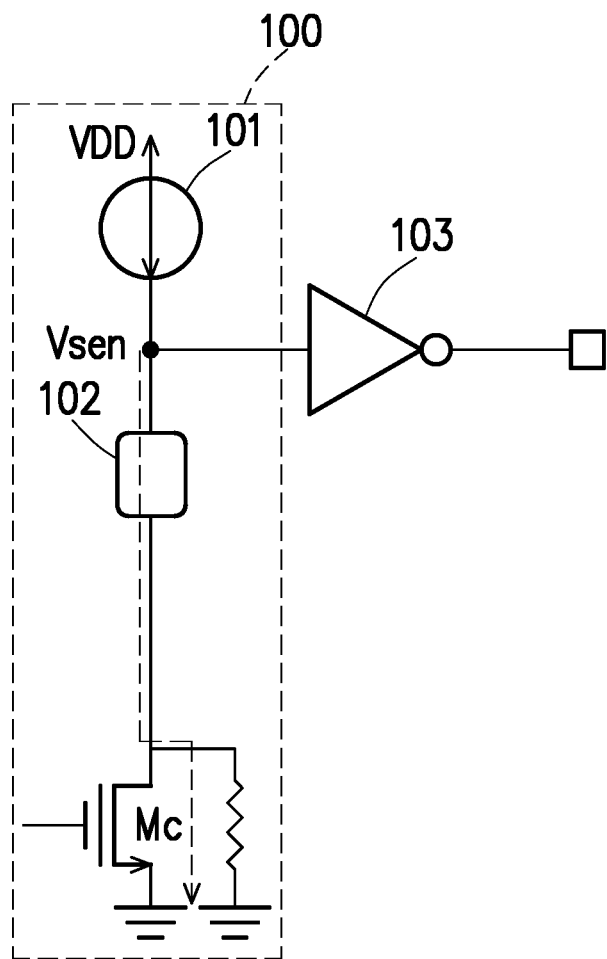
FIG. 1 is a schematic diagram showing a basic circuit structure of an OTP memory (or MTP memory).
Figure 3:
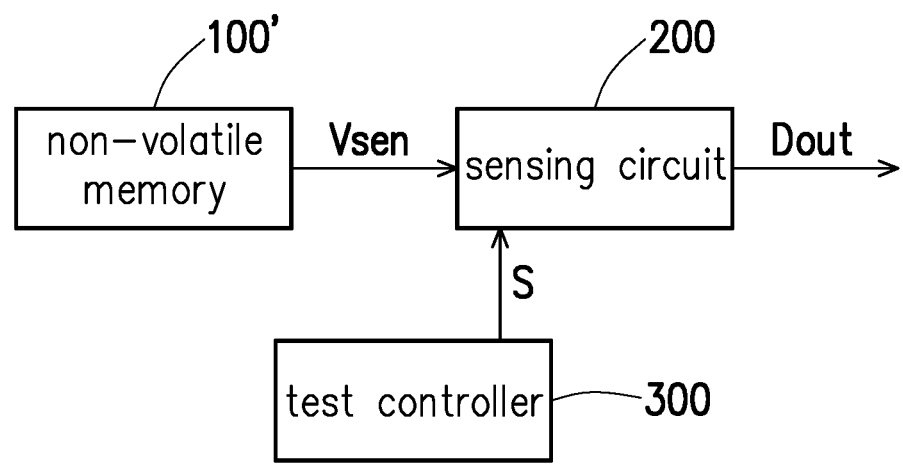
FIG. 3 is a schematic block diagram showing a test circuit of the disclosure.

FIG. 3 is a schematic block diagram of a test circuit of the disclosure. The test circuit shown in FIG. 3 can be applied to, for example, the CP stage to detect whether the transistor in the non-volatile memory has a leakage current path with low impedance characteristics or a leakage current path with high impedance characteristics. Referring to FIG. 2A, FIG. 2B, and FIG. 3, the test circuit includes a non-volatile memory 100' to be tested, a sensing circuit 200, and a test controller 300. The non-volatile memory 100' may be the OTP memory (or MTP memory) 100 as shown in FIG. 1 and FIG. 2. The structure of the sensing circuit 200 can be found in the description of the sensing circuit 200 shown in FIG. 2, and will not be repeated hereinafter. The test controller 300 is configured to generate a control signal S. The sensing circuit 200 forms or disconnects the conduction path between the control terminal of the transistor M4 and the node N2 according to the control signal S. The test controller 300 is, for example, a microprocessor, a central processing unit (CPU), a programmable general-purpose or special-purpose microprocessor, a digital signal processor (DSP), a programmable controller, an application specific integrated circuit (ASIC), a programmable logic device (PLD), other similar devices or a combination of these devices.

The test device shown in FIG. 3 can operate in a first test mode or a second test mode. The first test mode is also called a normal test mode, and the second test mode is also called a high impedance path test mode. When the test device operates in the first test mode, the test controller 300 causes the sensing circuit 200 to disconnect the conduction path between the control terminal of the transistor M4 and the node N2 through the control signal S. The transistor M3 and the transistor M4 do not operate due to the disconnection of the aforementioned conduction path. At this time, it is equivalent to that the sensing circuit 200 obtains the sensing result Dout via the inverter (constituted by the transistor M1 and the transistor M2) and the buffer B.

When the test device is in the first test mode and the non-volatile memory 100' is programmed with a writing voltage equivalent to the bit value "0", if the sensing result Dout equivalent to the bit value "0" is obtained, it indicates that the non-volatile memory 100' does not have a leakage current path with low impedance characteristics. However, if the sensing result Dout equivalent to the bit value "1" is obtained, it indicates that the non-volatile memory 100' has a leakage current path with low impedance characteristics. When the test device is in the second test mode and the non-volatile memory 100' is programmed with a writing voltage equivalent to the bit value "0", if the sensing result Dout equivalent to the bit value "0" is obtained, it indicates that the non-volatile memory 100' does not have a leakage current path with high impedance characteristics. However, if the sensing result Dout equivalent to the bit value "1" is obtained, it indicates that the non-volatile memory 100' has a leakage current path with high impedance characteristics.

Figure 4:
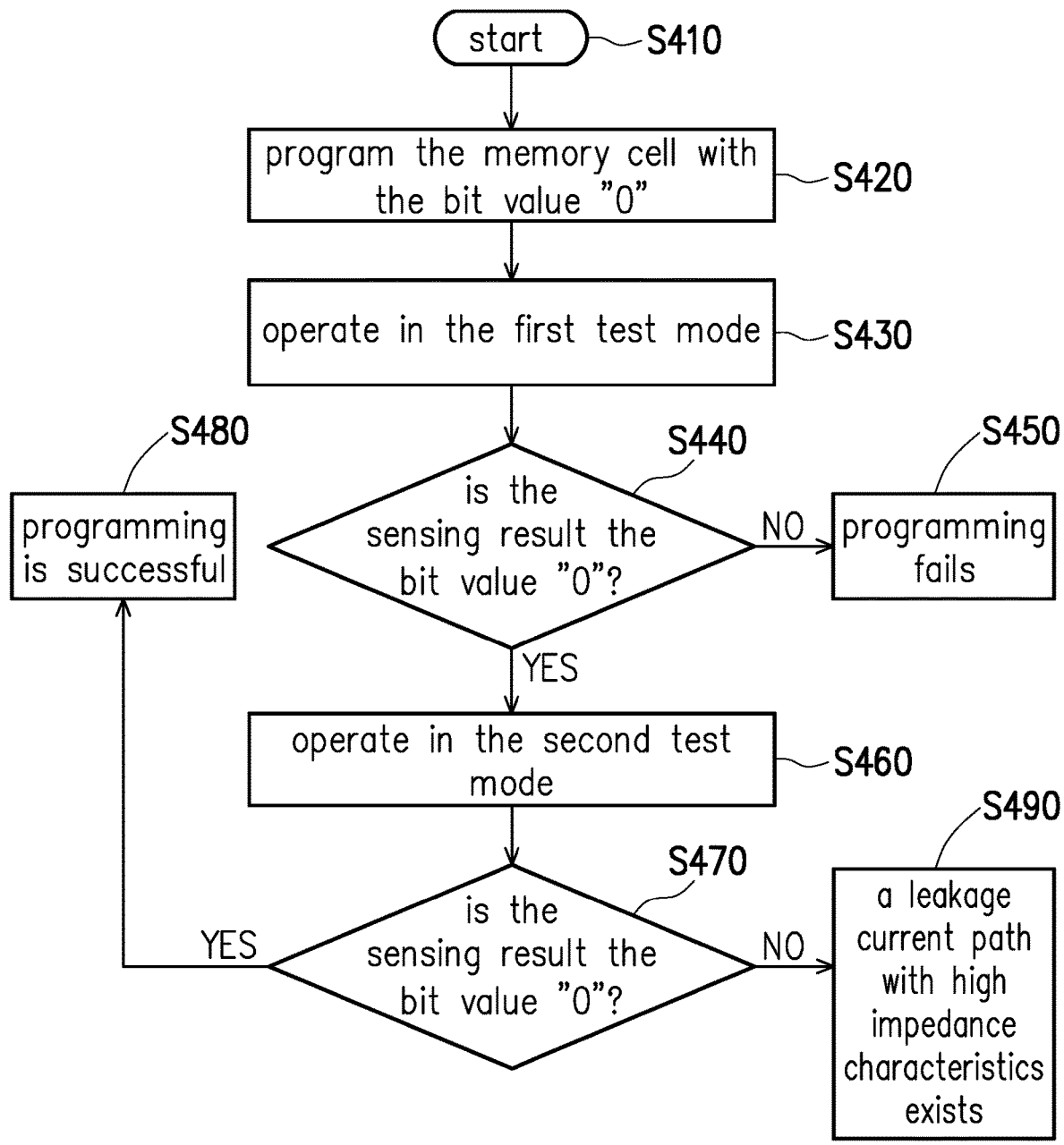
FIG. 4 is a flowchart showing steps of detecting whether a leakage current path with high impedance characteristics exists according to the first embodiment of the disclosure.

FIG. 4 is a flowchart showing steps of detecting whether a leakage current path with high impedance characteristics exists according to the first embodiment of the disclosure. Referring to FIG. 2A, FIG. 2B, FIG. 3, and FIG. 4, the process starts at step S410. In step S420, all memory cells of the non-volatile memory 100' are programmed with a voltage value equivalent to the bit value "0", and the remaining steps of FIG. 4 are executed for each memory cell. In step S430, the test device is operated in the first test mode (the transistor M3 and the transistor M4 do not operate due to the disconnection of the conduction path), and step S440 is executed. In step S440, it is confirmed whether the sensing result Dout is the bit value "0". If the result is NO (the sensing result Dout is the bit value "1"), it indicates that the non-volatile memory 100' has a leakage current path with low impedance characteristics, which causes the programming to fail (step S450). If the result is YES (the sensing result Dout is the bit value "0"), it indicates that the non-volatile memory 100' does not have a leakage current path with low impedance characteristics, but it cannot rule out the possibility that the non-volatile memory 100' may erroneously obtain the same sensing result as the ideal state (the sensing result Dout is the bit value "0") due to the leakage current path with high impedance characteristics. Therefore, step S460 is executed then.

In step S460, the test device is switched to the second test mode (the transistor M3 and the transistor M4 operate due to the formation of the conduction path), and step S470 is executed. In step S470, it is confirmed whether the sensing result Dout is the bit value "0". If the sensing result Dout obtained in the second test mode is still the bit value "0", it indicates that the non-volatile memory 100' is successfully programmed (step S480). If the sensing result Dout obtained in the second test mode is the bit value "1", it indicates that the non-volatile memory 100' has a leakage current path with high impedance characteristics (step S490). By executing the first test mode, it can be confirmed whether the non-volatile memory 100' has a leakage current path with low impedance characteristics. By executing the second test mode, it can be further confirmed whether the non-volatile memory 100' has a leakage current path with high impedance characteristics. In this way, it is possible to prevent defective products having a leakage current path with high impedance characteristics from passing the CP test by mistake. As a result, in the stage where the subsequent product is actually used, it is possible to prevent the leakage current path of the non-volatile memory 100' from changing from high-sensing voltage characteristics to low-sensing voltage characteristics under a low-voltage operation of the system and causing a general failure (reading error).

In addition, even if a leakage current path with high/low impedance characteristics does not exist, when the non-volatile memory 100' has a reading path with high impedance characteristics (for example, high impedance signal noise caused by process variation such as narrow line width), a reading error may still occur. In the CP detection stage, the non-volatile memory 100' having a reading path with high impedance characteristics will be detected and regarded as a defective product due to the reading error. However, such a reading error is caused by the reading path with high impedance characteristics, rather than a defect of the non-volatile memory 100'. In fact, the non-volatile memory 100' is usable. Therefore, this situation also causes additional product yield loss.

Figure 5:
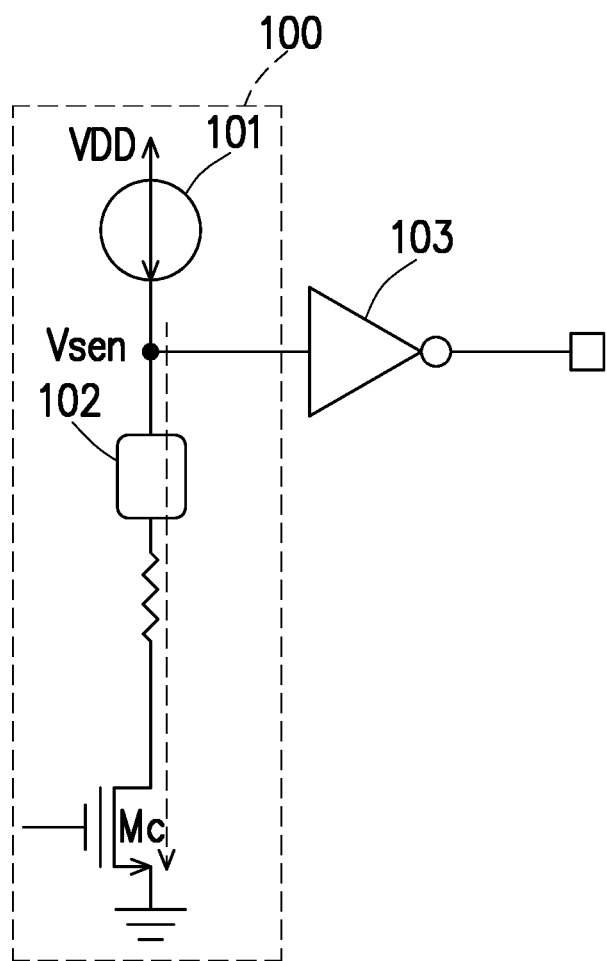
FIG. 5 is a schematic diagram showing a basic circuit structure of an OTP memory (or MTP memory).

FIG. 5 is a schematic diagram showing a basic circuit structure of an OTP memory (or MTP memory). The circuit structure shown in FIG. 5 is basically the same as the circuit structure shown in FIG. 1, the only difference lies in that the OTP memory (or MTP memory) 100 shown in FIG. 5 has a reading path with high impedance characteristics, instead of a leakage current path with high/low impedance characteristics.

Referring to FIG. 5, when the transistor Mc is erased with a writing voltage equivalent to the bit value "1" (the transistor Mc is turned on and the reading voltage Vsen is pulled down), the OTP memory (or MTP memory) 100 should obtain the sensing result of the bit value "1" ideally. However, due to the presence of the reading path with high impedance characteristics (see the dotted line shown in FIG. 5), the reading voltage Vsen is at a relatively high voltage level (greater than half the operating voltage), which causes the sense amplifier 103 to erroneously obtain the sensing result of the bit value "0", and a reading error occurs.

Figure 6:
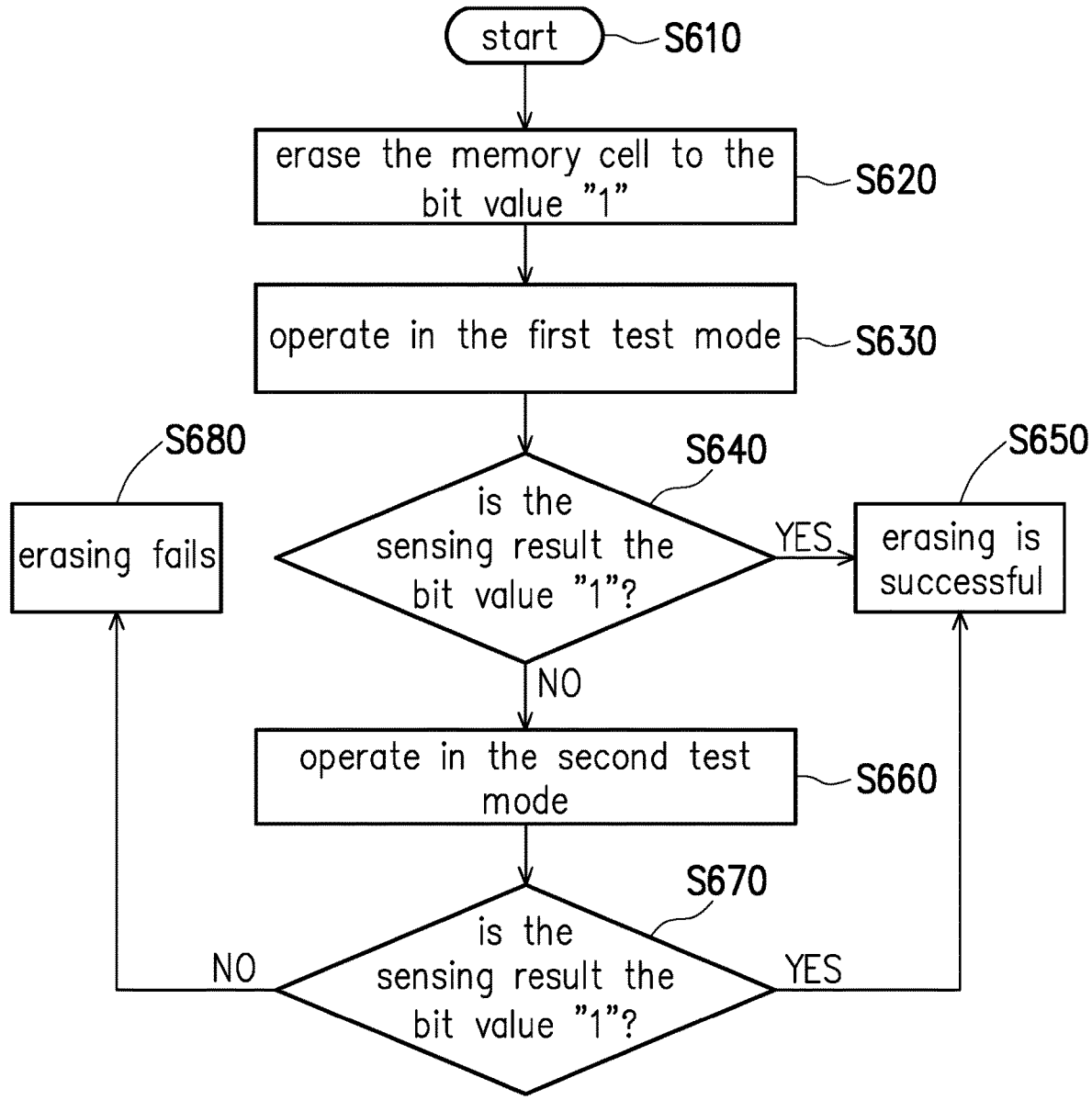
FIG. 6 is a flowchart showing steps of detecting whether a reading path with high impedance characteristics exists according to the first embodiment of the disclosure.

In the disclosure, the sensing circuit 200 shown in FIG. 2A and FIG. 2B can be further used to detect whether the non-volatile memory has a reading path with high impedance characteristics. Also, in the stage where the end product is used, the sensing circuit can be switched to the second test mode for sensing to correct the result, thereby improving the yield. FIG. 6 is a flowchart showing steps of detecting whether a reading path with high impedance characteristics exists according to the first embodiment of the disclosure. Referring to FIG. 2A, FIG. 2B, FIG. 3, and FIG. 6, the process starts at step S610. In step S620, all memory cells of the non-volatile memory 100' are erased, so that the storage state thereof is equivalent to the bit value "1", and the remaining steps in FIG. 6 are executed for each memory cell. In step S630, the test device is operated in the first test mode (the transistor M3 and the transistor M4 do not operate due to the disconnection of the conduction path), and step S640 is executed. In step S640, it is confirmed whether the sensing result Dout is the bit value "1". If the result is YES, it indicates that the erasing is successful (step S650). If the result is NO (the sensing result Dout is the bit value "0"), it indicates that due to the presence of a reading path with high impedance characteristics, a reading error may occur. Therefore, step S660 is executed then. In step S660, the test device is operated in the second test mode (the transistor M3 and the transistor M4 operate due to the formation of the conduction path) to confirm whether the non-volatile memory 100' has a reading failure due to the presence of a reading path with high impedance characteristics, or a structural defect of the non-volatile memory 100' causes an erasing failure. In step S670, it is confirmed whether the sensing result Dout is the bit value "1". If the result is YES (the sensing result Dout has been corrected/compensated), it indicates that the erasing is successful (step S650). If the result is NO (the sensing result Dout is the bit value "0"), it indicates that the erasing fails (step S680).

In this way, even if the non-volatile memory 100' has a reading path with high impedance characteristics, the sensing result Dout can be corrected/compensated through the structure shown in FIG. 2A and FIG. 2B to prevent the non-volatile memory 100' from failing to pass the CP detection stage and being regarded as a defective product. Moreover, by applying the second test mode and keeping this mode in the end product, the yield of the product can be improved.

Table (1) records the sensing results of the non-volatile memory 100' in various states in the first test mode and the second test mode.

TABLE (1)

| State of non-volatile memory | Sensing result in the first test mode | Sensing result in the second test mode |
| --- | --- | --- |
| Erasing | Bit value "1" | Bit value "1" |
| Leakage current path/reading path with high impedance characteristics | Bit value "0" | Bit value "1" |
| Programming | Bit value "0" | Bit value "0" |
| Insufficient programming margin | Bit value "1" | Bit value "1" |

Referring to FIG. 2A, FIG. 2B, and Table (1), in the erasing state, the non-volatile memory 100' is written with the bit value "1" and the transistor Mc is turned on. At this time, the sensing result Dout obtained through the first test mode is the bit value "1". In addition, in the second test mode, since the transistor M1 is turned on and the transistor M2 and the transistor M3 are both turned off, the obtained sensing result Dout is also the bit value "1" (corresponding to the voltage value of 3.3V). In the case where a path with high impedance characteristics (whether a leakage current path or a reading path) exists, the sensing result Dout obtained through the first test mode is the bit value "0" instead. In addition, in the second test mode, since the transistor M1 is turned off, the transistor M2 is partially turned on (or fully turned on), and the transistor M3 and the transistor M4 are both turned on, the obtained sensing result Dout is the bit value "1" (corresponding to the voltage value of 3.3V). In the programming state, the non-volatile memory 100' is written with the bit value "0" and the transistor Mc is turned off. At this time, the sensing result Dout obtained through the first test mode is the bit value "0". In addition, in the second test mode, since the transistor M1 is turned off and the transistor M2 and the transistor M3 are both turned on, the obtained sensing result Dout is also the bit value "0" (corresponding to the voltage value of 0V). In the case of an insufficient programming margin, the non-volatile memory 100' is written with the bit value "0" but the transistor Mc is not turned off. At this time, the sensing result Dout obtained through the first test mode is the bit value "1". In addition, in the second test mode, since the transistor M1 is turned on and the transistor M2 and the transistor M3 are both turned off, the obtained sensing result Dout is also the bit value "1" (corresponding to the voltage value of 3.3V).

It can be seen that, except for the presence of a path with high impedance characteristics (whether a leakage current path or a reading path), in the other states, the sensing results Dout obtained through the first test mode and the second test mode are the same. Therefore, by sequentially executing the first test mode and the second test mode, it is possible to confirm whether the non-volatile memory 100' has a path with high impedance characteristics (whether a leakage current path or a reading path).

The sensing circuit 200 shown in FIG. 2A and FIG. 2B is designed for the transistor Mc of the non-volatile memory, which is an N-type MOSFET. Based on the same concept of the disclosure, another sensing circuit can be designed for a situation where the transistor Mc is a P-type MOSFET.

Figure 7:
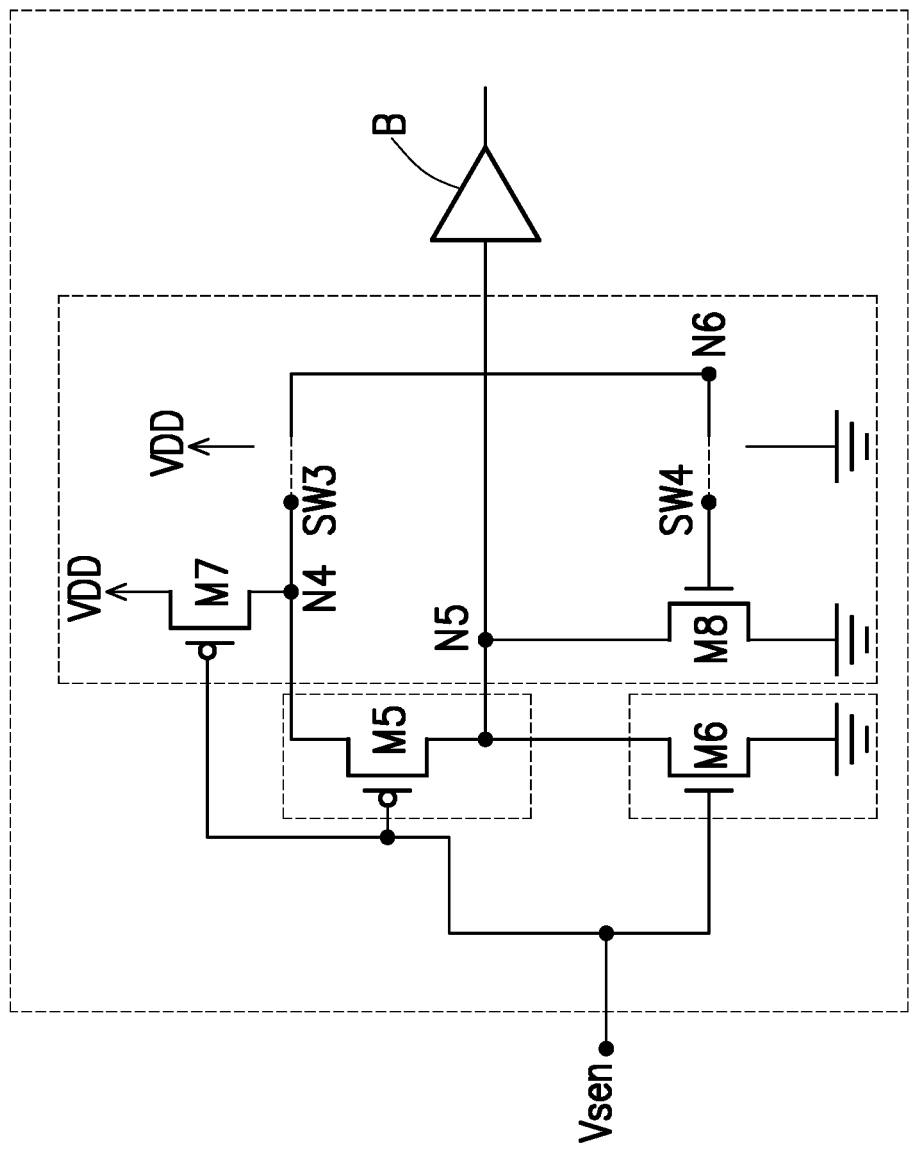
FIG. 7 is a schematic circuit diagram of a test circuit according to the second embodiment of the disclosure.

FIG. 7 is a schematic circuit diagram of a test circuit according to the second embodiment of the disclosure. A sensing circuit 200' shown in FIG. 7 is designed for a situation where the transistor Mc is a P-type MOSFET. As shown in FIG. 7, the sensing circuit 200' is configured to generate a sensing result Dout according to a reading voltage Vsen of a non-volatile memory. The sensing circuit 200' includes transistors M5 to M8, a switch SW3, a switch SW4, and a buffer B. The first terminal of the transistor M5 is coupled to a node N4. The second terminal of the transistor M5 is coupled to a node N5. The control terminal of the transistor M5 receives the reading voltage Vsen (that is, the operation of the transistor M5 is controlled by the reading voltage Vsen). The first terminal of the transistor M6 is coupled to the second terminal of the transistor M5 (that is, the node N5). The second terminal of the transistor M6 is coupled to a reference ground voltage. The first terminal of the transistor M7 receives an operating voltage VDD. The second terminal of the transistor M7 is coupled to the node N4. In addition, the control terminal of the transistor M7, the control terminal of the transistor M6, and the control terminal of the transistor M5 are coupled together. The transistor M5 and the transistor M6 constitute an inverter. The first terminal of the transistor M8 is coupled to the node N5. The second terminal of the transistor M8 is coupled to the reference ground voltage. In addition, the control terminal of the transistor M8 is coupled to the node N4 via a conduction path. In this embodiment, the transistor M5 and the transistor M7 may be P-type MOSFETs, and the transistor M6 and the transistor M8 may be N-type MOSFETs.

The first terminal of the switch SW3 is coupled to the node N4. The second terminal of the switch SW3 is selectively coupled to one of the operating voltage VDD and the node N6 according to a control signal. The first terminal of the switch SW4 is coupled to the control terminal of the transistor M8. The second terminal of the switch SW4 is selectively coupled to one of the reference ground voltage and the node N6 according to the control signal. The switch SW3 and the switch SW4 are controlled by the control signal to operate synchronously, thereby constituting a switch group. The switch group forms or disconnects a conduction path from the control terminal of the transistor M8 to the node N4 according to the control signal. For example, when the control signal is at a first voltage level (for example, a high voltage level), the switch SW3 and the switch SW4 operate synchronously to form the aforementioned conduction path. When the control signal is at a second voltage level (for example, a low voltage level), the switch SW3 and the switch SW4 operate synchronously to disconnect the aforementioned conduction path. The input terminal of the buffer B is coupled to the node N5 to receive a voltage signal of the node N5. The function of the buffer B is to digitize the analog voltage signal of the node N5 to output the digital sensing result Dout. In an embodiment, the buffer B may be realized by two inverters connected in series.

Since the sensing circuit 200' shown in FIG. 7 can be regarded as a complementary circuit structure of the sensing circuit 200 shown in FIG. 2A and FIG. 2B, a detailed description of the circuit operation of FIG. 7 is omitted hereinafter. Simply put, in the case where the non-volatile memory has a high impedance leakage current path/reading path, the function of the sensing circuit 200 shown in FIG. 2A and FIG. 2B is to maintain the voltage of the node N1 at a high voltage level through the transistor M3, the transistor M4, and a negative feedback path therebetween. In contrast of the complementary circuit structure, the function of the sensing circuit 200 shown in FIG. 2A and FIG. 2B is to maintain the voltage of the node N5 at a low voltage level through the transistor M7, the transistor M8, and a negative feedback path therebetween.

The sensing circuit 200' shown in FIG. 7 can be applied to the test circuit shown in FIG. 3. In other words, the structure of the sensing circuit 200 in FIG. 3 may be the same as the sensing circuit 200' in FIG. 7. Similarly, when the test circuit shown in FIG. 3 operates in the first test mode, the test controller 300 generates the control signal S to control the sensing circuit 200' to disconnect the conduction path between the control terminal of the transistor M8 and the node N4. When the test circuit shown in FIG. 3 operates in the second test mode, the test controller 300 generates the control signal S to control the sensing circuit 200' to form the conduction path between the control terminal of the transistor M8 and the node N4.

Figure 8:
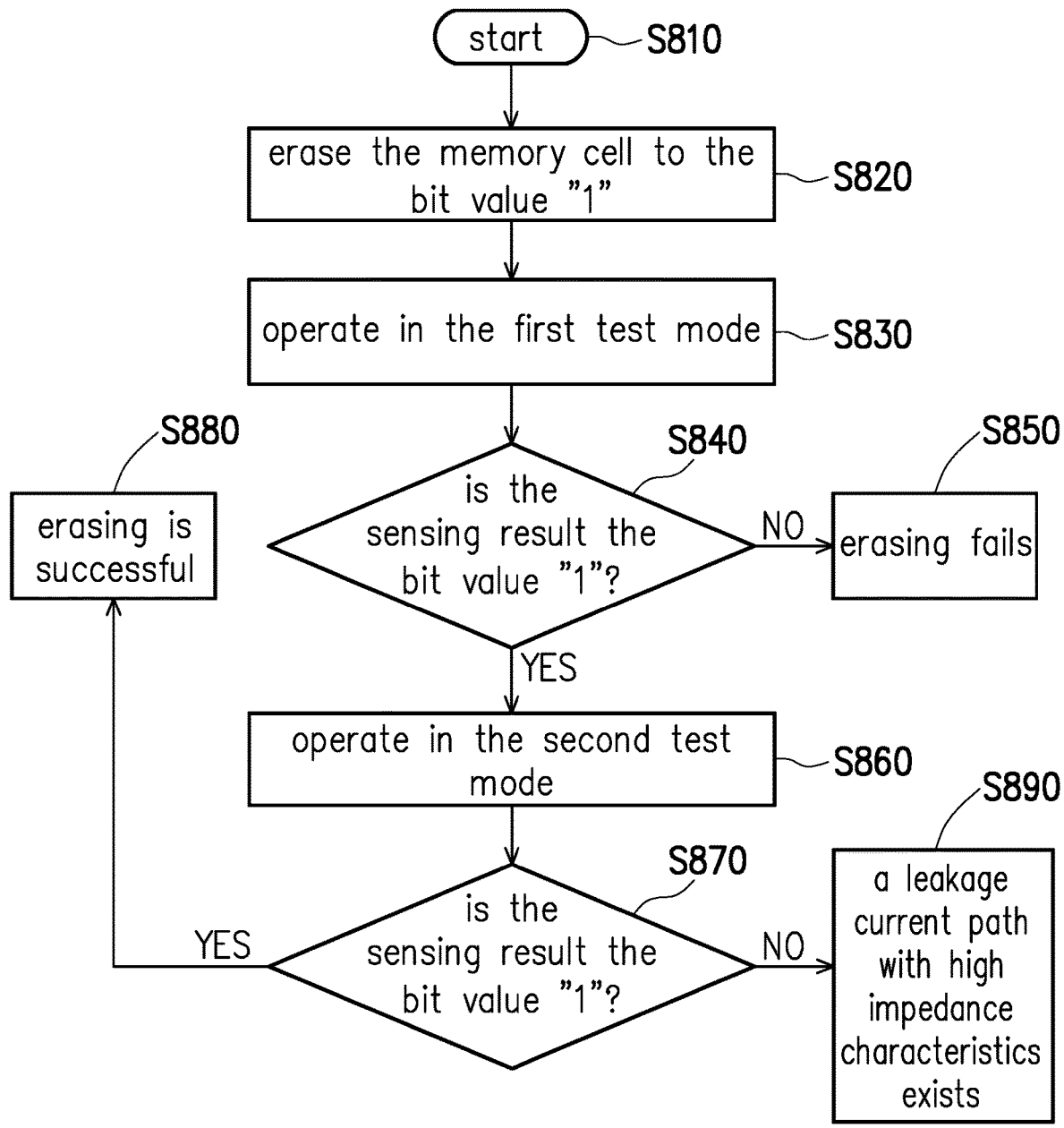
FIG. 8 is a flowchart showing steps of detecting whether a leakage current path with high impedance characteristics exists according to the second embodiment of the disclosure.

FIG. 8 is a flowchart showing steps of detecting whether a leakage current path with high impedance characteristics exists according to the second embodiment of the disclosure. Referring to FIG. 3, FIG. 7, and FIG. 8, and the process starts at step S810. In step S820, all memory cells of the non-volatile memory 100' are erased to the bit value "1", and the remaining steps of FIG. 8 are executed for each memory cell. In step S830, the test device is operated in the first test mode (the transistor M7 and the transistor M8 do not operate due to the disconnection of the conduction path), and step S840 is executed. In step S840, it is confirmed whether the sensing result Dout is the bit value "1". If the result is NO (the sensing result Dout is the bit value "0"), it indicates that the non-volatile memory 100' fails to be erased (step S850). If the result is YES (the sensing result Dout is the bit value "1"), it indicates that the non-volatile memory 100' does not have a leakage current path with low impedance characteristics, but it cannot rule out the possibility that the non-volatile memory 100' may erroneously obtain the same sensing result as the ideal state (the sensing result Dout is the bit value "1") due to the leakage current path with high impedance characteristics. Therefore, step S860 is executed then.

In step S860, the test device is switched to the second test mode (the transistor M7 and the transistor M8 operate due to the formation of the conduction path), and step S870 is executed. In step S870, it is confirmed whether the sensing result Dout is the bit value "1". If the sensing result Dout obtained in the second test mode is still the bit value "1", it indicates that the non-volatile memory 100' is successfully erased (step S880). If the sensing result Dout obtained in the second test mode is the bit value "0", it indicates that the non-volatile memory 100' has a leakage current path with high impedance characteristics (step S890). By executing the first test mode, it can be confirmed whether the non-volatile memory 100' has a leakage current path with low impedance characteristics. By executing the second test mode, it can be further confirmed whether the non-volatile memory 100' has a leakage current path with high impedance characteristics. In this way, it is possible to prevent defective products having a leakage current path with high impedance characteristics from passing the CP test by mistake. As a result, in the stage where the subsequent product is actually used, it is possible to prevent the leakage current path of the non-volatile memory 100' from changing from high-sensing voltage characteristics to low-sensing voltage characteristics under a low-voltage operation of the system and causing a general failure (reading error).

In addition, in the CP detection stage, the non-volatile memory 100' having a reading path with high impedance characteristics may be detected and regarded as a defective product due to a reading error. To avoid this problem, the sensing circuit 200' shown in FIG. 7 can be further used to detect whether the non-volatile memory has a reading path with high impedance characteristics, and in the stage where the end product is used, the sensing circuit is switched to the second test mode for sensing to correct the result, thereby improving the yield.

Figure 9:
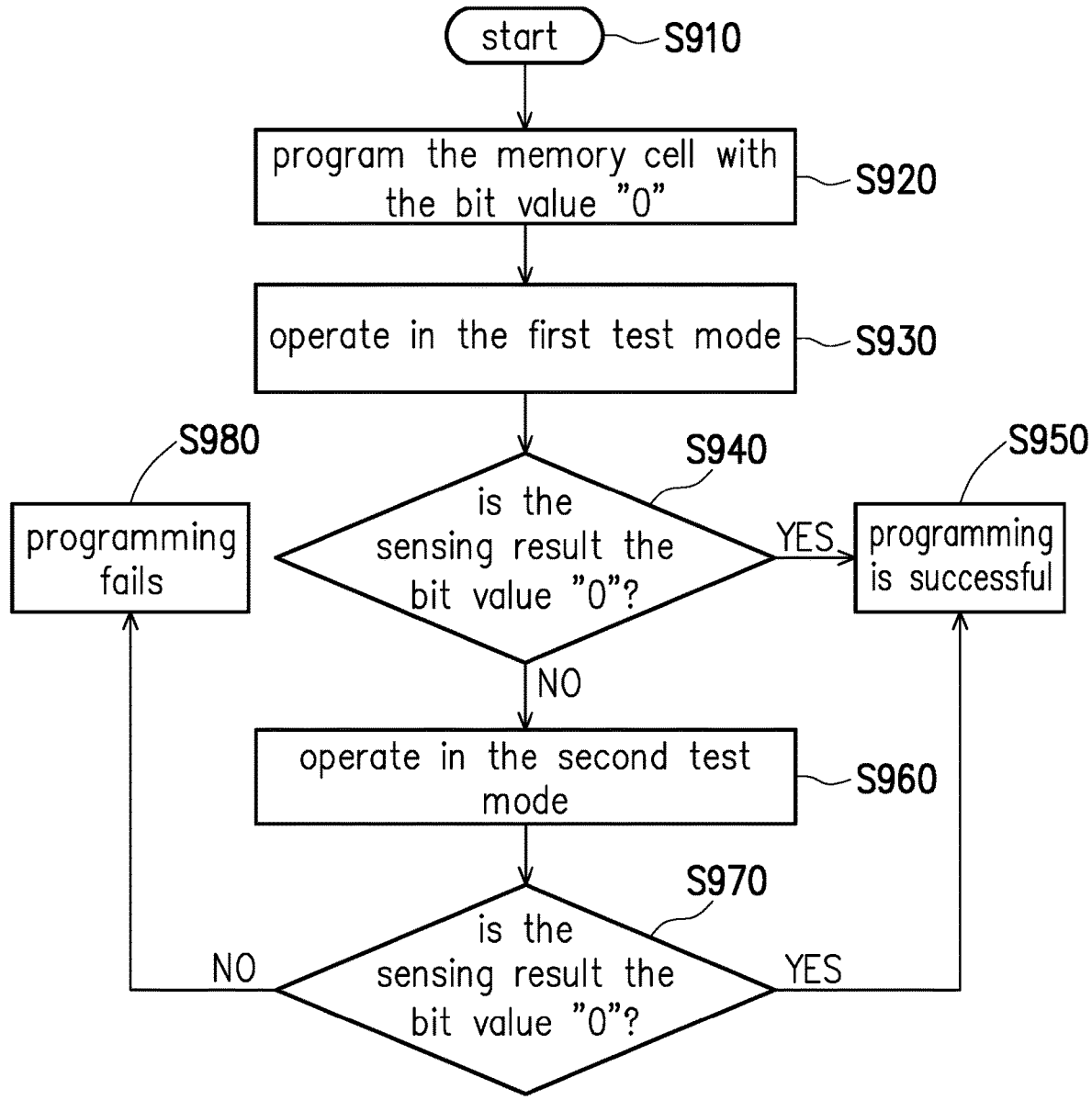
FIG. 9 is a flowchart showing steps of detecting whether a reading path with high impedance characteristics exists according to the second embodiment of the disclosure.

FIG. 9 is a flowchart showing steps of detecting whether a reading path with high impedance characteristics exists according to the second embodiment of the disclosure. Referring to FIG. 3, FIG. 7, and FIG. 9, and the process starts at step S910. In step S920, all memory cells of the non-volatile memory 100' are programmed with a voltage equivalent to the bit value "0", and the remaining steps of FIG. 9 are executed for each memory cell. In step S930, the test device is operated in the first test mode (the transistor M7 and the transistor M8 do not operate due to the disconnection of the conduction path), and step S940 is executed. In step S940, it is confirmed whether the sensing result Dout is the bit value "0". If the result is YES, it indicates that the programming is successful (step S950). If the result is NO (the sensing result Dout is the bit value "1"), it indicates that due to the presence of a reading path with high impedance characteristics, a reading error may occur. Therefore, step S960 is executed then. In step S960, the test device is operated in the second test mode (the transistor M7 and the transistor M8 operate due to the formation of the conduction path) to confirm whether the non-volatile memory 100' has a reading failure due to the presence of a reading path with high impedance characteristics, or a structural defect of the non-volatile memory 100' causes an erasing failure. In step S970, it is confirmed whether the sensing result Dout is the bit value "0". If the result is YES (the sensing result Dout has been corrected/compensated), it indicates that the programming is successful (step S950). If the result is NO (the sensing result Dout is the bit value "1"), it indicates that the programming fails (step S980).

In this way, even if the non-volatile memory 100' has a reading path with high impedance characteristics, the sensing result Dout can be corrected/compensated through the structure shown in FIG. 7 to prevent the non-volatile memory 100' from failing to pass the CP detection stage and being regarded as a defective product. Moreover, by applying the second test mode to directly use the end product, the yield of the product can be improved.

It should be noted that although the above embodiments are all based on an OTP memory (or MTP memory) as an example, the disclosure is not limited thereto. In other embodiments, the sensing circuit and the test device of the disclosure can be applied to any non-volatile memory, including a read-only memory (ROM), a flash memory, and a non-volatile random access memory (NVRAM). The read-only memory includes a programmable read-only memory (PROM), an electrically alterable read-only memory (EAROM), an erasable programmable read-only memory (EPROM), an electrically erasable programmable read-only memory (EEPROM), a mask-programmed read-only memory (Mask ROM), and a fuse-programmed read-only memory (Fuse ROM).

In summary, the disclosure can perform the first test mode and the second test mode by controlling the operation of the switches in the sensing circuit (as shown in FIG. 2A, FIG. 2B, and FIG. 7). The disclosure can detect whether the non-volatile memory has a leakage current path with high impedance characteristics by sequentially performing the first test mode and the second test mode. Furthermore, the disclosure can also detect whether the non-volatile memory has a reading path with high impedance characteristics and automatically compensate the sensing result by sequentially performing the first test mode and the second test mode.

In this way, it is possible to prevent the problem that a non-volatile memory having a leakage current path with high impedance characteristics passes the test but has a general failure (reading error) in subsequent use. In addition, in response to the presence of a reading path with high impedance characteristics, the sensing result can be compensated to improve the product yield. Therefore, the reliability and yield of the product can be improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A sensing circuit configured to generate a sensing result according to a reading voltage of a non-volatile memory, the sensing circuit comprising:
   a first transistor coupled between an operating voltage and a first node;
   a second transistor coupled between the first node and a second node;
   a third transistor coupled between the second node and a reference ground voltage, wherein a control terminal of the first transistor, a control terminal of the second transistor, and a control terminal of the third transistor all receive the reading voltage;
   a fourth transistor coupled between the operating voltage and the first node; and
   a switch group controlled by a control signal,
   wherein the switch group is configured to form a conduction path between a control terminal of the fourth transistor and the second node according to a first state of the control signal, so that the first node obtains a first sensing result,
   wherein the switch group is configured to disconnect the conduction path between the control terminal of the fourth transistor and the second node according to a second state of the control signal, so that the first node obtains a second sensing result.

2. The sensing circuit according to claim 1, wherein the switch group comprises:
   a first switch arranged between the control terminal of the fourth transistor and a third node; and
   a second switch arranged between the second node and the third node,
   wherein when the control signal is at a first voltage level, the first switch and the second switch form the conduction path, and
   wherein when the control signal is at a second voltage level, the first switch and the second switch operate to be respectively coupled to the operating voltage and the reference ground voltage to disconnect the conduction path.

3. The sensing circuit according to claim 1, wherein the first transistor and the fourth transistor are P-type metal-oxide-semiconductor field-effect transistors, and the second transistor and the third transistor are N-type metal-oxide-semiconductor field-effect transistors.

4. The sensing circuit according to claim 1, further comprising:
   a buffer coupled to the first node for digitizing the sensing result that is analog.

5. The sensing circuit according to claim 4, wherein the buffer comprises two inverters connected in series.

6. The sensing circuit according to claim 1, wherein the non-volatile memory is a one-time programmable memory or a multi-time programmable memory.

7. A test device configured to generate a test result according to a reading voltage of a non-volatile memory, the test device comprising:
   a non-volatile memory programmed with a voltage value corresponding to a bit value;
   the sensing circuit according to claim 1; and
   a test controller configured to:
   generate the control signal, so that the switch group disconnects the conduction path according to the control signal to enter a first test mode, and when the sensing result obtained by executing the first test mode is the bit value, cause the switch group to conduct the conduction path according to the control signal to enter a second test mode; and
   when the sensing result obtained by executing the second test mode is not the bit value, generate the test result to indicate that the non-volatile memory has a high impedance leakage current path.

8. The test device according to claim 7, wherein the test controller is further configured to:
   when the sensing result obtained by executing the first test mode is not the bit value, generate the test result to indicate that the non-volatile memory has a low impedance leakage current path that causes a programming result to fail.

9. The test device according to claim 7, wherein the test controller is further configured to:
   when the sensing result obtained by executing the second test mode is the bit value, generate the test result to indicate that the programming result is successful.

10. A test device configured to generate a test result according to a reading voltage of a non-volatile memory, the test device comprising:
    a non-volatile memory erased with a voltage value corresponding to a bit value;
    the sensing circuit according to claim 1; and a test controller configured to:
  generate the control signal, so that the switch group disconnects the conduction path according to the control signal to enter a first test mode, and when the sensing result obtained by executing the first test mode is not the bit value, cause the switch group to conduct the conduction path according to the control signal to enter a second test mode; and
  when the sensing result obtained by executing the second test mode is the bit value, generate the test result to indicate that the sensing result has been corrected for a reading bit value error caused by a high impedance reading path of the non-volatile memory.

11. The test device according to claim 10, wherein the test controller is further configured to:
  when the sensing result obtained by executing the first test mode is the bit value, generate the test result to indicate that an erasing result is successful.

12. The test device according to claim 10, wherein the test controller is further configured to:
  when the sensing result obtained by executing the second test mode is not the bit value, generate the test result to indicate that the erasing result fails.

13. A sensing circuit configured to generate a sensing result according to a reading voltage of a non-volatile memory, the sensing circuit comprising:
  a first transistor coupled between a first node and a second node, wherein a control terminal of the first transistor receives the reading voltage;
  a second transistor coupled between the second node and a reference ground voltage;
  a third transistor coupled between an operating voltage and the first node, wherein a control terminal of the third transistor is coupled to a control terminal of the second transistor and receives the reading voltage;
  a fourth transistor coupled between the second node and the reference ground voltage; and
  a switch group controlled by a control signal,
  wherein the switch group is configured to form a conduction path between the first node and a control terminal of the fourth transistor according to a first state of the control signal, so that the second node obtains a first sensing result,
  wherein the switch group is configured to disconnect the conduction path between the first node and a control terminal of the fourth transistor according to a second state of the control signal, so that the second node obtains a second sensing result.

14. The sensing circuit according to claim 13, wherein the switch group comprises:
  a first switch arranged between the first node and a third node; and
  a second switch arranged between the third node and the control terminal of the fourth transistor,
  wherein when the control signal is at a first voltage level, the first switch and the second switch form the conduction path, and
  wherein when the control signal is at a second voltage level, the first switch and the second switch operate to be respectively coupled to the operating voltage and the reference ground voltage to disconnect the conduction path.

15. The sensing circuit according to claim 13, wherein the first transistor and the third transistor are P-type metal-oxide-semiconductor field-effect transistors, and the second transistor and the fourth transistor are N-type metal-oxide-semiconductor field-effect transistors.

16. The sensing circuit according to claim 13, further comprising:
  a buffer coupled to the second node for digitizing the sensing result that is analog.

17. The sensing circuit according to claim 16, wherein the buffer comprises two inverters connected in series.

18. The sensing circuit according to claim 13, wherein the non-volatile memory is a one-time programmable memory or a multi-time programmable memory.

19. A test device configured to generate a test result according to a reading voltage of a non-volatile memory, the test device comprising:
  a non-volatile memory erased with a voltage value corresponding to a bit value;
  the sensing circuit according to claim 13; and
  a test controller configured to:
  generate the control signal, so that the switch group disconnects the conduction path according to the control signal to enter a first test mode, and when the sensing result obtained by executing the first test mode is the bit value, cause the switch group to conduct the conduction path according to the control signal to enter a second test mode; and
  when the sensing result obtained by executing the second test mode is not the bit value, generate the test result to indicate that the non-volatile memory has a high impedance leakage current path.

20. The test device according to claim 19, wherein the test controller is further configured to:
  when the sensing result obtained by executing the first test mode is not the bit value, generate the test result to indicate that an erasing result fails.

21. The test device according to claim 19, wherein the test controller is further configured to:
  when the sensing result obtained by executing the second test mode is the bit value, generate the test result to indicate that the erasing result is successful.

22. A test device configured to generate a test result according to a reading voltage of a non-volatile memory, the test device comprising:
  a non-volatile memory programmed with a voltage value corresponding to a bit value;
  the sensing circuit according to claim 13; and
  a test controller configured to:
  generate the control signal, so that the switch group disconnects the conduction path according to the control signal to enter a first test mode, and when the sensing result obtained by executing the first test mode is not the bit value, cause the switch group to conduct the conduction path according to the control signal to enter a second test mode; and
  when the sensing result obtained by executing the second test mode is the bit value, generate the test result to indicate that the sensing result has been corrected for a reading bit value error caused by a high impedance reading path of the non-volatile memory.

23. The test device according to claim 22, wherein the test controller is further configured to:
  when the sensing result obtained by executing the first test mode is the bit value, generate the test result to indicate that a programming result is successful.

24. The test device according to claim 22, wherein the test controller is further configured to:
  when the sensing result obtained by executing the second test mode is not the bit value, generate the test result to indicate that the programming result fails.

* * * * *